US011244810B2

(12) United States Patent
Mori et al.

(10) Patent No.: US 11,244,810 B2
(45) Date of Patent: Feb. 8, 2022

(54) ELECTRIC FIELD SENSOR, SURFACE WAVE PLASMA SOURCE, AND SURFACE WAVE PLASMA PROCESSING APPARATUS

(71) Applicant: TOKYO ELECTRON LIMITED, Tokyo (JP)

(72) Inventors: Kiyoshi Mori, Fuchu (JP); Yuki Osada, Yamanashi (JP); Jun Nakagomi, Yamanashi (JP); Yoshiyuki Harima, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 81 days.

(21) Appl. No.: 16/872,778

(22) Filed: May 12, 2020

(65) Prior Publication Data
US 2020/0365371 A1    Nov. 19, 2020

(30) Foreign Application Priority Data

May 13, 2019    (JP) .............................. JP2019-090821

(51) Int. Cl.
*H01J 37/32*    (2006.01)
*H05H 1/46*    (2006.01)

(52) U.S. Cl.
CPC ......... *H01J 37/32192* (2013.01); *H05H 1/46* (2013.01); *H05H 1/463* (2021.05)

(58) Field of Classification Search
CPC .... H05H 1/46; H05H 1/4645; H05H 2245/36; H05H 1/4622; H05H 1/463; H05H 2240/10; H05H 2240/20; H05H 2242/20; H05H 1/30; A61L 2/14; A61L 2202/11; A61L 2202/24; A61L 2/24; A61L 2202/25; A61L 2/0029; A61L 2/03; A61L 2/26; A61L 2202/16; A61L 2202/26; A61L 2209/213; A61L 31/18; A61L 31/10; A61L 2/0011; A61L 2/02; A61L 2202/122; A61L 2202/17; A61L 31/16; A61L 2300/608; A61L 2400/12; A61L 2/12; A61L 2/20;

(Continued)

(56) References Cited

U.S. PATENT DOCUMENTS

2018/0249342 A1\*    8/2018    Rappaport ............... H04B 3/52
2020/0014423 A1\*    1/2020    Britz ....................... H04B 1/04

FOREIGN PATENT DOCUMENTS

JP    2000-294550 A    10/2000
JP    2013-77441 A     4/2013

\* cited by examiner

*Primary Examiner* — Monica C King
(74) *Attorney, Agent, or Firm* — Fenwick & West LLP

(57) ABSTRACT

An electric field sensor includes a probe, a cylindrical probe guide, an insulating member, a preload spring and a connector. The probe serves as an inner conductor of a coaxial transmission path and has a portion forming a monopole antenna at a tip end to be in constant contact with a microwave transmission window by a pressing force of a built-in spring thereof. The probe guide is disposed at an outer side of the probe and serves as an outer conductor of the coaxial transmission path. The insulating member is disposed between the probe and the probe guide. The preload spring preloads the probe guide downward and presses the probe guide so that the tip end of the probe guide comes in constant contact with the planar slot antenna. The connector is connected to the probe and the probe guide to connect coaxial signal cables for extracting signals.

16 Claims, 12 Drawing Sheets

(58) Field of Classification Search
CPC ............ A61L 2202/14; A61L 2300/44; A61L 31/082; A61L 9/14; A61L 9/22
See application file for complete search history.

FIG.10A  FIG.10B  FIG.10C
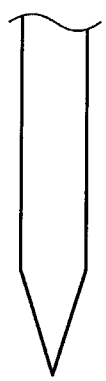  
  
FIG.10D FIG.10E  FIG.10F
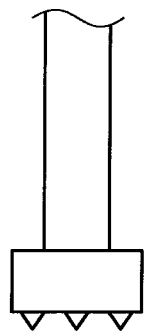 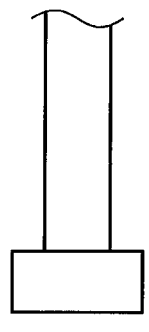 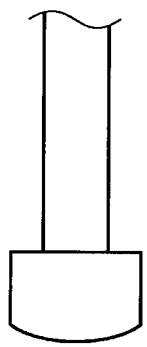
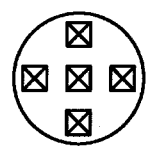 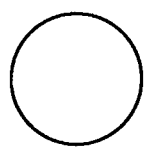 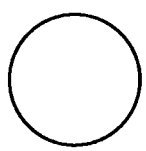

ELECTRIC FIELD SENSOR, SURFACE WAVE PLASMA SOURCE, AND SURFACE WAVE PLASMA PROCESSING APPARATUS

CROSS-REFERENCE TO RELATED APPLICATION

This application claims priority to Japanese Patent Application No. 2019-090821, filed on May 13, 2019, the entire contents of which are incorporated herein by reference.

TECHNICAL FIELD

The present disclosure relates to an electric field sensor, a surface wave plasma source, and a surface wave plasma processing apparatus.

BACKGROUND

In a semiconductor device manufacturing process, plasma processing such as etching, film formation, or the like is often performed on a semiconductor substrate. Recently, a microwave plasma processing apparatus capable of uniformly generating high-density plasma having a low electron temperature attracted attention as a plasma processing apparatus for performing such plasma processing.

Japanese Patent Application Publication No. 2000-294550 discloses an RLSA (Registered Trademark) microwave plasma processing apparatus as a microwave processing apparatus. In the RLSA (Registered Trademark) microwave plasma processing apparatus, a planar slot antenna having a plurality of slots formed in a predetermined pattern is disposed at an upper portion of a chamber and microwaves guided from a microwave generation source are emitted from the slots of the planar slot antenna. Then, the microwaves are fed into the chamber maintained in a vacuum state through a dielectric microwave transmission window disposed below the planar slot antenna. A gas introduced into the chamber is turned into plasma by a microwave electric field, and a semiconductor wafer is processed by the plasma thus generated.

Japanese Patent Application Publication No. 2013-77441 discloses a technique of inserting an electric field sensor into a sensor insertion hole that is formed to penetrate through an antenna is suggested as a technique for detecting a power outputted from the antenna or a state of the plasma directly below the antenna in the above-described microwave plasma processing apparatus.

The present disclosure provides an electric field sensor, a surface wave plasma source using the electric field sensor, and a surface wave plasma processing apparatus. The electric field sensor can stably detect an electric field of microwaves by suppressing the influence of noise or the like in the surface wave plasma source that is used for generating surface wave plasma by emitting microwaves into a chamber from slots of a planar slot antenna and a microwave transmission window.

SUMMARY

In accordance with an aspect of the present disclosure, there is provided an electric field sensor for detecting an electric field of microwaves in generating surface wave plasma by emitting microwaves transmitted through a microwave transmission path into a chamber through slots of a planar slot antenna and a microwave transmission window made of a dielectric material, the electric field sensor including: a probe serving as an inner conductor of a coaxial transmission path and having a built-in spring and a portion forming a monopole antenna at a tip end thereof so that the tip end of the probe is in constant contact with a rear surface of the microwave transmission window by a pressing force of the built-in spring; a cylindrical probe guide disposed at an outer side of the probe, serving as an outer conductor of the coaxial transmission path, and having a tip end to be in contact with a rear surface of the planar slot antenna; an insulating member disposed between the probe and the probe guide; a preload spring configured to preload the probe guide downward and press the probe guide so that the tip end of the probe guide comes in constant contact with the planar slot antenna; and a connector connected to the probe and the probe guide and configured to connect coaxial signal cables for extracting signals.

BRIEF DESCRIPTION OF THE DRAWINGS

The objects and features of the present disclosure will become apparent from the following description of embodiments, given in conjunction with the accompanying drawings, in which:

FIGS. 10A to 10F show examples of a shape of a tip end of a probe in the electric field sensor;

DETAILED DESCRIPTION

Hereinafter, embodiments of the present disclosure will be described in detail with reference to the accompanying drawings that form a part hereof.

(Configuration of Surface Wave Plasma Processing Apparatus)

Figure 1:
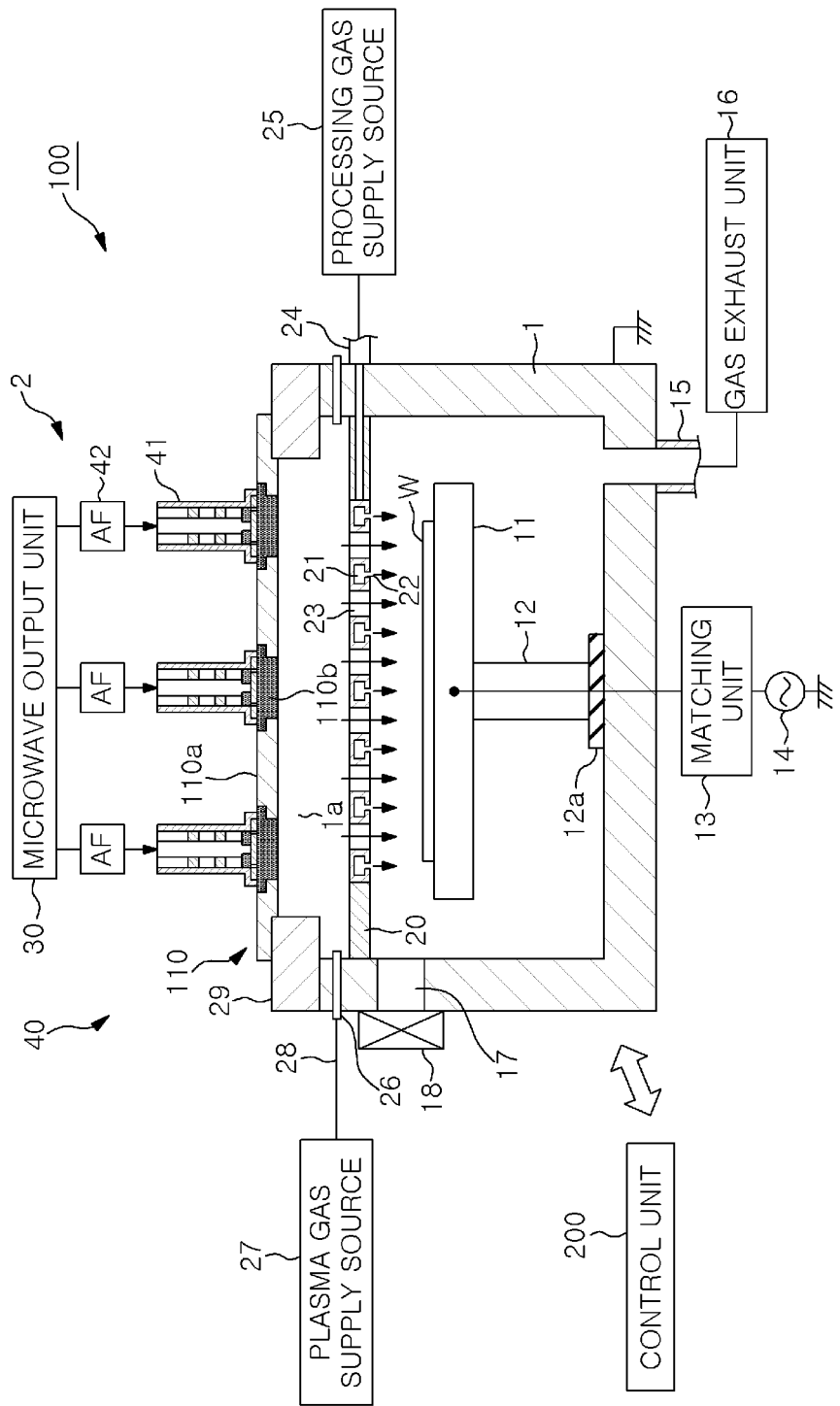
FIG. 1 is a cross-sectional view showing a schematic configuration of a surface wave plasma processing apparatus using a surface wave plasma source according to an embodiment.
Figure 2:
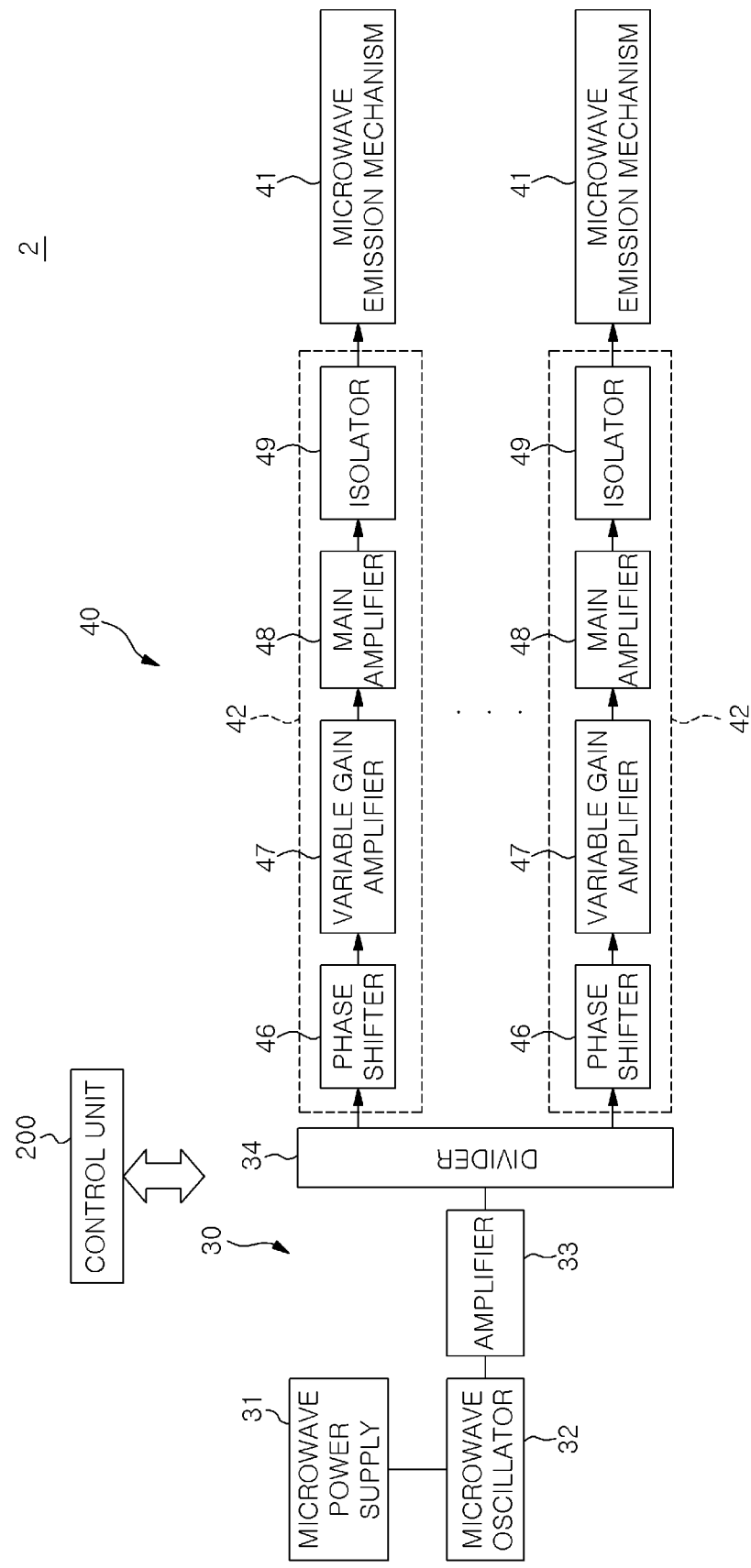
FIG. 2 is a block diagram showing a configuration of the surface wave plasma source used in the surface wave plasma processing apparatus shown in FIG. 1.
Figure 3:
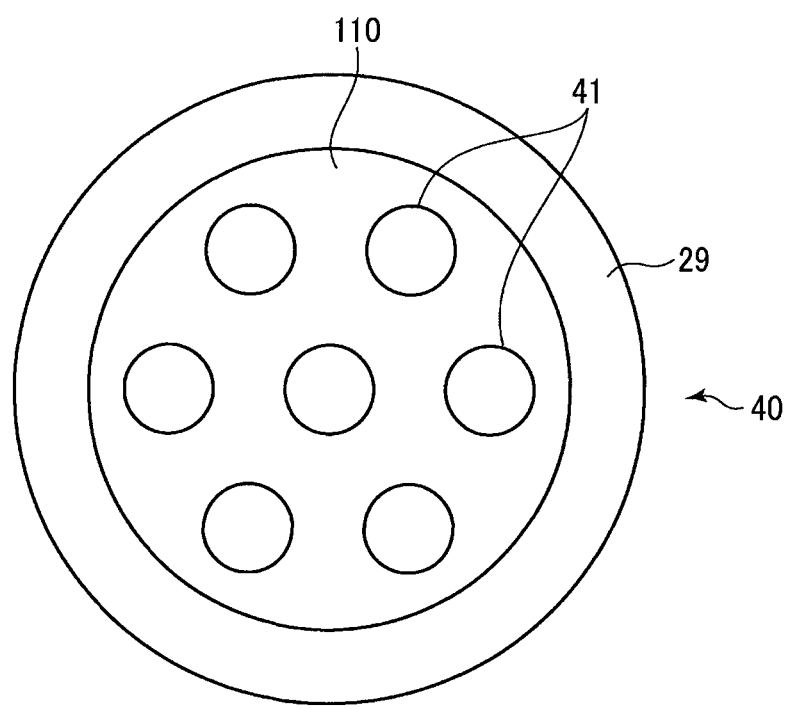
FIG. 3 is a top view schematically showing a microwave supply unit in the surface wave plasma source.
Figure 4:
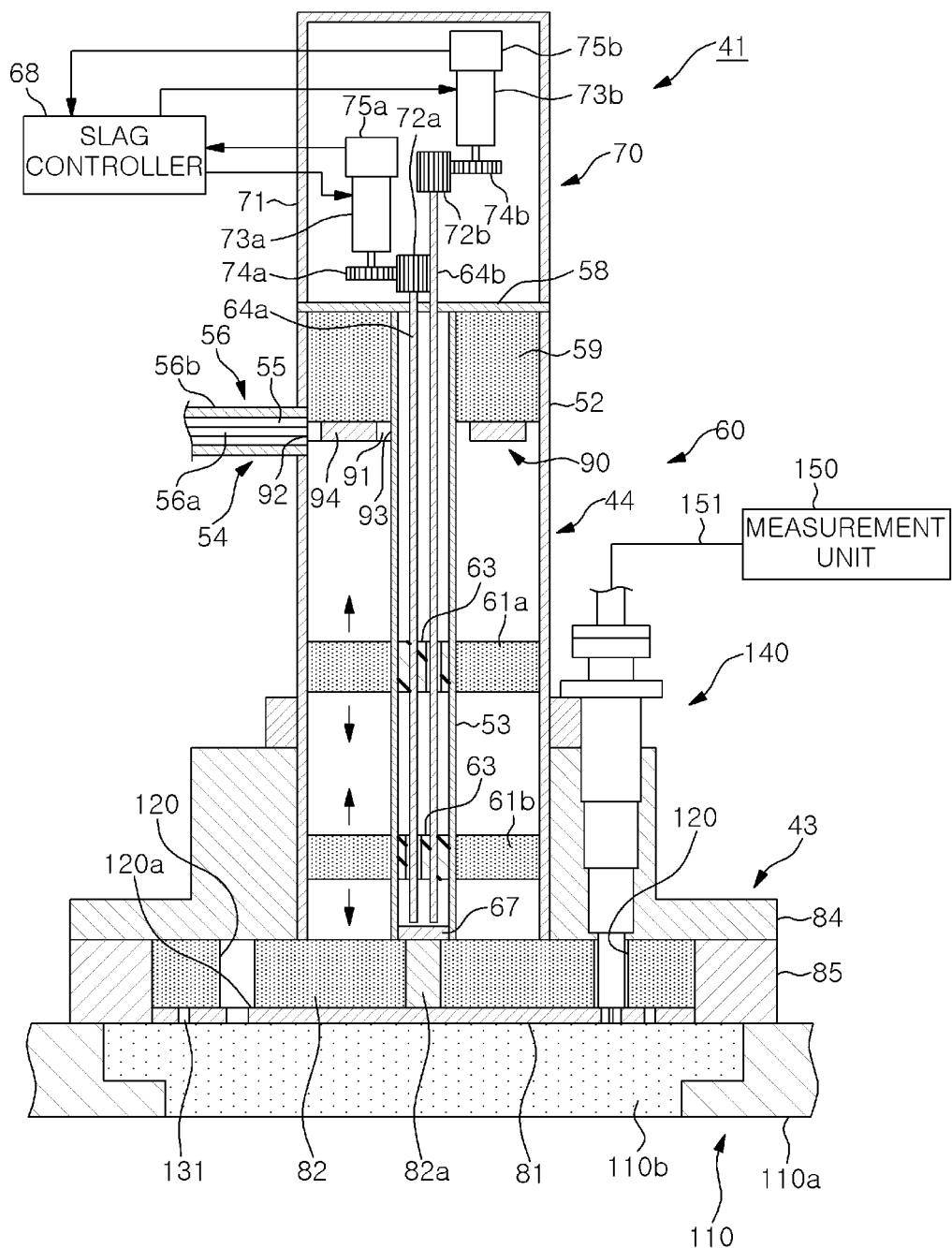
FIG. 4 is a vertical cross-sectional view showing a microwave emission mechanism and an electric field sensor in the surface wave plasma source.
Figure 5:
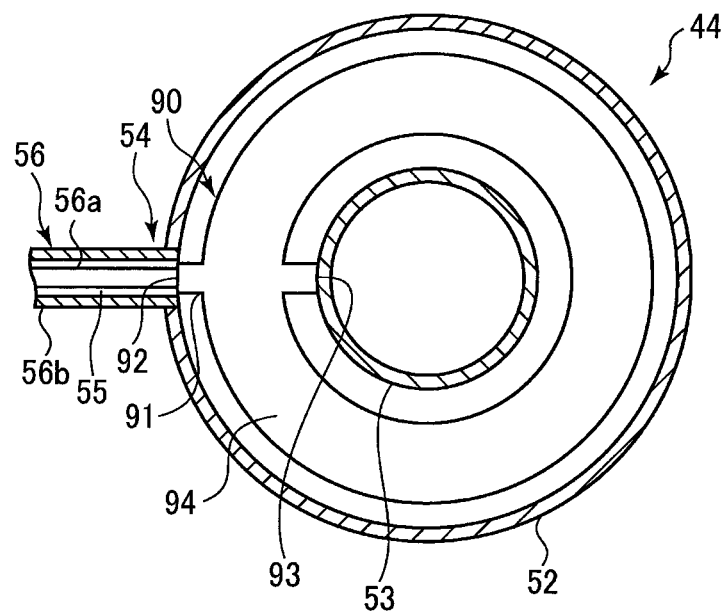
FIG. 5 is a horizontal cross-sectional view showing a power supply mechanism of the microwave emission mechanism.
Figure 6:
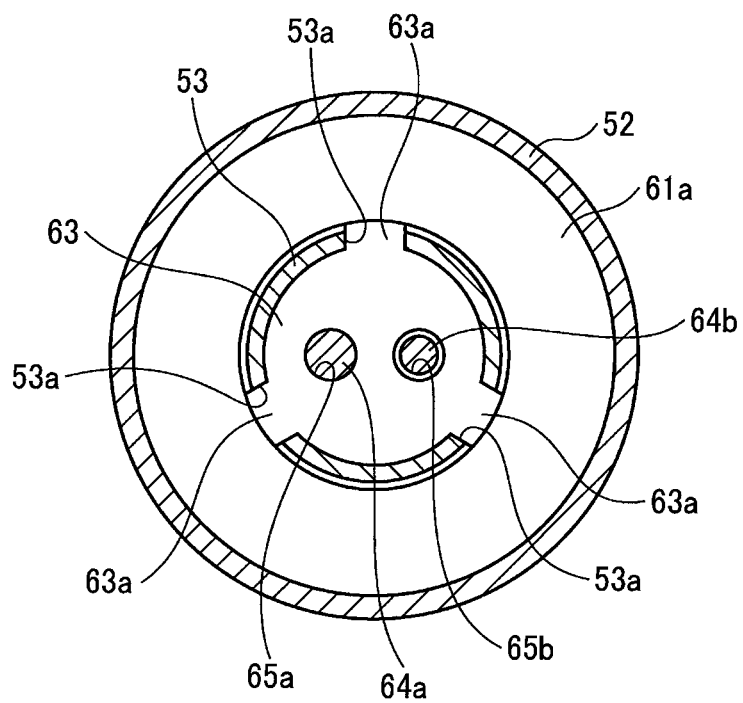
FIG. 6 is a horizontal cross-sectional view showing a slag and a sliding member in a tuner.

FIG. 1 is a cross-sectional view showing a schematic configuration of a surface wave plasma processing apparatus using a surface wave plasma source according to an embodiment. FIG. 2 is a block diagram showing a configuration of the surface wave plasma source used in the surface wave plasma processing apparatus shown in FIG. 1. FIG. 3 is a top view schematically showing a microwave supply unit in the surface wave plasma source. FIG. 4 is a vertical cross-sectional view showing a microwave emission mechanism and an electric field sensor in the surface wave plasma source. FIG. 5 is a horizontal cross-sectional view showing a power supply mechanism of the microwave emission mechanism. FIG. 6 is a horizontal cross-sectional view showing a slag and a sliding member in a tuner.

A surface wave plasma processing apparatus 100 is configured as a plasma etching apparatus for performing plasma processing, e.g., etching, on a semiconductor wafer W (hereinafter, referred to as "wafer W") as a substrate. The surface wave plasma processing apparatus 100 includes a substantially cylindrical airtight chamber 1 made of a metal such as aluminum, stainless steel or the like, the chamber 1 being frame-grounded, and a surface wave plasma source 2 for generating surface wave plasma in the chamber 1. An opening 1a is formed at an upper portion of the chamber 1. The surface wave plasma source 2 is disposed to face the inside of the chamber 1 through the opening 1a.

In the chamber 1, a susceptor 11 that is a support member for horizontally supporting the wafer W is supported by a cylindrical supporting member 12 extended upward from a bottom center of the chamber 1 through an insulating member 12a. The susceptor 11 and the supporting member 12 may be made of a material, e.g., aluminum having an anodically oxidized surface.

Although they are not illustrated, the susceptor 11 includes an electrostatic chuck for electrostatically attracting and holding the wafer W, a temperature control mechanism, a gas channel for supplying a heat transfer gas to a backside of the wafer W, lifter pins that are raised and lowered to transfer the wafer W, and the like. A high-frequency bias power supply 14 is electrically connected to the susceptor 11 through a matching unit 13. By supplying a high-frequency power from the high-frequency bias power supply 14 to the susceptor 11, ions in the plasma are attracted toward the wafer W.

A gas exhaust line 15 is connected to a bottom portion of the chamber 1. A gas exhaust unit 16 including a vacuum pump is connected to the gas exhaust line 15. By operating the gas exhaust unit 16, a gas in the chamber 1 is exhausted and a pressure in the chamber 1 can be rapidly reduced to a predetermined vacuum level. A loading/unloading port 17 for loading and unloading the wafer W and a gate valve 18 for opening and closing the loading/unloading port 17 are disposed at a sidewall of the chamber 1.

A shower plate 20 for injecting a processing gas for plasma etching toward the wafer W is horizontally disposed above the susceptor 11 in the chamber 1. The shower plate 20 has lattice-shaped gas channels 21 and a plurality of gas injection holes 22 formed at the gas channels 21. Space portions 23 are defined between the lattice-shaped gas channels 21. A line 24 extending to the outside of the chamber 1 is connected to the gas channels 21 of the shower plate 20. A processing gas supply source 25 is connected to the line 24. A general etching gas, e.g., $Cl_2$ gas or the like may be used as the processing gas.

A ring-shaped plasma gas introducing member 26 is disposed along a chamber wall at a position above the shower plate 20 of the chamber 1. A plurality of gas injection holes are formed in an inner circumferential portion of the plasma gas introducing member 26. A plasma gas supply source 27 for supplying a plasma gas is connected to the plasma gas introducing member 26 through a line 28. Ar gas or the like is preferably used as the plasma generating gas.

The plasma gas introduced into the chamber 1 from the plasma gas introducing member 26 is turned into plasma by microwaves introduced into the chamber 1 from the surface wave plasma source 2. The processing gas injected through the gas injection holes 22 of the shower plate 20 is excited by the plasma passing through the space portions 23 of the shower plate 20 to thereby generate plasma of the processing gas.

(Surface Wave Plasma Source)

Next, the surface wave plasma source 2 will be described.

The surface wave plasma source 2 has a circular ceiling plate 110 supported by a support ring 29 disposed at an upper portion of the chamber 1. The space between the support ring 29 and the ceiling plate 110 is airtightly sealed. As shown in FIG. 2, the surface wave plasma source 2 includes a microwave output unit 30 for distributing and outputting microwaves through a plurality of channels, and a microwave supply unit 40 for transmitting and radiating the microwaves outputted from the microwave output unit 30 into the chamber 1.

The microwave output unit 30 includes a microwave power supply 31, a microwave oscillator 32, an amplifier 33 for amplifying the oscillated microwave, and a divider 34 for dividing the amplified microwave into a plurality of microwaves.

The microwave oscillator 32 oscillates the microwave at a predetermined frequency (e.g., 915 MHz) by using PLL (phase-locked loop), for example. The divider 34 divides the microwave amplified by the amplifier 33 while matching an impedance between an input side and an output side to minimize the loss of the microwaves. The frequency of the microwaves is not limited to 915 MHz and may be within a range of 700 MHz to 3 GHz.

The microwave supply unit 40 includes a plurality of amplifier units (AF) 42 for mainly amplifying the microwaves divided by the divider 34 and microwave emission mechanisms 41 respectively connected to the amplifier units 42.

As shown in FIG. 3, for example, seven microwave emission mechanisms 41 are arranged on the ceiling plate 110. Specifically, six microwave emission mechanisms 41 are disposed along a circumference of the ceiling plate 110 and one microwave emission mechanism 41 is disposed at the center of the ceiling plate 110. An electric field sensor 140 to be described later is disposed in each of the microwave emission mechanisms 41.

The ceiling plate 110 serves as a vacuum seal and a microwave transmission plate. The ceiling plate 110 includes a metal frame 110a and microwave transmission windows 110b made of a dielectric material such as quartz or the like. The microwave transmission windows 110b are fitted into the frame 110a to correspond to the portions where the microwave emission mechanisms 41 are disposed.

The amplifier unit 42 includes a phase shifter 46, a variable gain amplifier 47, a main amplifier 48 constituting a solid state amplifier, and an isolator 49.

The phase shifter 46 is configured to shift the phase of the microwaves, and the radiation characteristics can be modulated by controlling the phase shifter 46. For example, the directivity can be controlled by adjusting the phase in each of the amplifier units 42 to thereby change the plasma distribution. Further, circularly polarized waves can be obtained by shifting the phase by 90° between adjacent amplifier units 42. The phase shifter 46 can also be used to control delay characteristics between components in the amplifier and perform spatial combination in a tuner. However, the phase shifter 46 may not be provided when it is unnecessary to modulate the radiation characteristics or to control the delay characteristics between the components in the amplifier.

The variable gain amplifier 47 controls the power levels of the microwaves to be inputted to the main amplifier 48 and adjusts the difference between the antenna modules or a plasma intensity. By controlling the variable gain amplifier 47 for each of the amplifier units 42, it is possible to adjust the distribution of the generated plasma.

The main amplifier 48 constituting the solid state amplifier may have, e.g., an input matching circuit, a semiconductor amplifying device, an output matching circuit, and a high Q resonant circuit.

The isolator 49 separates reflected microwaves that are reflected by the microwave emission mechanism 41 and directed toward the main amplifier 48. The isolator 49 includes a circulator and a dummy load (coaxial terminator). The circulator guides the microwaves reflected by the antenna unit 43 of the microwave emission mechanism 41 to be described later to the dummy load, and the dummy load converts the reflected microwaves guided by the circulator into heat.

The respective components of the surface wave plasma processing apparatus 100 are controlled by a control unit 200 having a microprocessor. The control unit 200 includes a storage unit, an input unit, a display, and the like. The storage unit stores process sequences of the surface wave plasma processing apparatus 100 and process recipes that are control parameters. The control unit 200 controls the plasma processing apparatus based on a selected process recipe.

(Microwave Emission Mechanism)

Hereinafter, the microwave emission mechanism 41 will be described in detail.

As shown in FIGS. 4 and 5, the microwave emission mechanism 41 includes a coaxial waveguide 44 for transmitting microwaves, and the antenna unit 43 for emitting the microwaves transmitted through the waveguide 44 into the chamber 1. Then, the microwaves emitted into the chamber 1 from the microwave emission mechanism 41 are coupled in the space inside the chamber 1 to thereby generate the surface wave plasma in the chamber 1.

The waveguide 44 has a cylindrical outer conductor 52 and a rod-shaped inner conductor 53 coaxially arranged within the outer conductor 52. The antenna unit 43 is disposed at a leading end of the waveguide 44. In the waveguide 44, the inner conductor 53 is used for the power supply and the outer conductor 52 is used for the ground. A reflection plate 58 is disposed at the upper ends of the outer conductor 52 and the inner conductor 53.

A power supply mechanism 54 for supplying microwaves (electromagnetic waves) is disposed at a base end of the waveguide 44. The power supply mechanism 54 includes a microwave power introduction port 55 disposed at a side surface of the waveguide 44 (the outer conductor 52) to introduce a microwave power. A coaxial cable 56 including an inner conductor 56a and an outer conductor 56b is connected to the microwave power introduction port 55. The coaxial cable 56 serves as a power supply line for supplying the microwaves amplified by the amplifier unit 42. A power supply antenna 90 extending horizontally into the inside of the outer conductor 52 is connected to a leading end of the inner conductor 56a of the coaxial cable 56.

The power supply antenna 90 is formed by machining a metal plate made of, e.g., aluminum or the like, and fitting the metal plate into a frame of a dielectric member made of Teflon (Registered Trademark) or the like. A wave retardation member 59 made of a dielectric material such as Teflon (Registered Trademark) is disposed between the reflection plate 58 and the power supply antenna 90 in order to shorten an effective wavelength of reflected waves. In the case of using a microwave having a high frequency of, e.g., 2.45 GHz, the wave retardation member 59 may not be provided. Here, the electromagnetic wave emitted from the power supply antenna 90 is reflected by the reflection plate 58, so that a maximum electromagnetic wave is transmitted into the coaxial waveguide 44. In that case, the distance from the power supply antenna 90 to the reflection plate 58 is set to be approximately a multiple of the half-wavelength of $\lambda g/4$. However, this may not apply to a microwave having a low frequency due to limits in the diametrical direction. In that case, it is preferable to optimize the shape of the power supply antenna 90 such that the antinode of the electromagnetic wave generated from the power supply antenna 90 is formed below the power supply antenna 90 without being formed at the power supply antenna 90.

As shown in FIG. 5, the power supply antenna 90 includes: an antenna main body 91 having a first pole 92 that is connected to the inner conductor 56a of the coaxial cable 56 in the microwave power introduction port 55 and through which electromagnetic waves are supplied and a second pole 93 through which the supplied electromagnetic waves; and a ring-shaped reflection portion 94 extending from both sides of the antenna main body 91 along the outer surface of the inner conductor 53. Standing waves are formed by the electromagnetic waves incident on the antenna main body 91 and the electromagnetic waves reflected by the reflection portion 94. The second pole 93 of the antenna main body 91 is in contact with the inner conductor 53.

By emitting microwaves (electromagnetic waves) from the power supply antenna 90, a microwave power is supplied to a space between the outer conductor 52 and the inner conductor 53. The microwave power supplied to the power supply mechanism 54 propagates toward the antenna unit 43.

A tuner 60 is disposed in the waveguide 44. The tuner 60 matches an impedance of a load (plasma) in the chamber 1 with a characteristic impedance of the microwave power supply 31 in the microwave output unit 30. The tuner 60 includes two slags 61a and 61b disposed between the outer conductor 52 and the inner conductor 53 and a slag driving unit 70 disposed at an outer side (upper side) of the reflection plate 58.

The slag 61a is disposed on the slag driving unit 70 side and the slag 61b is disposed on the antenna unit 43 side. Two slag moving shafts 64a and 64b are disposed in the inner space of the inner conductor 53 along the longitudinal direction. The two slag moving shafts 64a and 64b are used for moving the slags and each of the two slag moving shafts 64a and 64b is formed of a screw rod having, e.g., a trapezoidal thread.

As shown in FIG. 6, the slag 61a is made of a dielectric material and has a circular ring shape. A sliding member 63 made of a resin having a slidable property is inserted in the slag 61a. The sliding member 63 has a screw hole 65a to which the slag moving shaft 64a is screw-coupled, and a through-hole 65b through which the slag moving shaft 64b is inserted. Although the slag 61b has the screw hole 65a and the through-hole 65b in the sliding member 63 as in the case of the slag 61a, unlike the case of the slag 61a, the screw hole 65a is screw-coupled to the slag moving shaft 64b and the slag moving shaft 64a is inserted through the through-hole 65b. Accordingly, the slag 61a is vertically moved by rotating the slag moving shaft 64a, and the slag 61b is vertically moved by rotating the slag moving shaft 64b. In other words, the slags 61a and 61b are vertically moved by a screw mechanism including the slag moving shafts 64a and 64b and the sliding member 63.

Three slits 53a are formed in the inner conductor 53 to extend along the longitudinal direction thereof and arranged at regular intervals circumferentially. The sliding member 63 has three protrusions 63a arranged at regular intervals to correspond to the slits 53a. The sliding member 63 is fitted into the slags 61a and 61b in a state where the protrusions 63a are brought into contact with the inner circumference of the slags 61a and 61b. The outer circumferential surface of the sliding member 63 is brought into contact with the inner circumferential surface of the inner conductor 53 without a gap therebetween. The sliding member 63 vertically slides along the inner conductor 53 by the rotation of the slag moving shaft 64a or 64b. In other words, the inner circumferential surface of the inner conductor 53 functions as a guide to control the sliding of the slags 61a and 61b.

The slag moving shafts 64a and 64b extend through the reflection plate 58 to the slag driving unit 70. A bearing (not shown) is disposed between the reflection plate 58 and each of the slag moving shafts 64a and 64b. Further, a bottom plate 67 made of a conductor is disposed at a lower end of the inner conductor 53. The lower ends of the slag moving shafts 64a and 64b are normally free ends so that vibration during operation can be absorbed, and the bottom plate 67 is separated from the lower ends of the slag moving shafts 64a and 64b by about 2 mm to 5 mm. The bottom plate 67 may serve as a bearing unit for supporting the lower ends of the slag moving shafts 64a and 64b.

The slag driving unit 70 includes a housing 71 and the slag moving shafts 64a and 64b extend into the housing 71. Gears 72a and 72b are attached to the upper ends of the slag moving shafts 64a and 64b, respectively. The slag driving unit 70 includes a motor 73a for rotating the slag moving shaft 64a and a motor 73b for rotating the slag moving shaft 64b. A gear 74a is attached to a shaft of the motor 73a and a gear 74b is attached to a shaft of the motor 73b. The gear 74a is engaged with the gear 72a and the gear 74b is engaged with the gear 72b. Accordingly, the slag moving shaft 64a is rotated by the motor 73a through the gears 74a and 72a and the slag moving shaft 64b is rotated by the motor 73b through the gears 74b and 72b. The motors 73a and 73b are, e.g., stepper motors.

Incremental encoders 75a and 75b for detecting the positions of the slags 61a and 61b are provided on the motors 73a and 73b to be directly coupled to output shafts thereof, respectively.

The positions of the slags 61a and 61b are controlled by a slag controller 68. Specifically, the slag controller 68 sends control signals to the motors 73a and 73b based on an impedance of an input terminal detected by an impedance detector (not shown) and position information of the slags 61a and 61b detected by the encoders 75a and 75b. The impedance is adjusted by controlling the positions of the slags 61a and 61b. The slag controller 68 performs impedance matching such that an impedance of a terminal is adjusted to, e.g., 50Ω. When only one of the two slags is moved, a trajectory of the impedance passes through the origin of the Smith chart. When both of the slags are moved at the same time, only the phase of the impedance is rotated.

The antenna unit 43 includes a planar slot antenna 81 for generating surface wave plasma having a planar shape and having slots 131 for emitting microwaves, and a wave retardation member 82 disposed on the rear surface (top surface) of the planar slot antenna 81. A columnar member 82a made of a conductor is provided to extend through the center of the wave retardation member 82 to connect the bottom plate 67 with the planar slot antenna 81. Accordingly, the inner conductor 53 is connected to the planar slot antenna 81 through the bottom plate 67 and the columnar member 82a. The wave retardation member 82 and the planar slot antenna 81 are formed in a disc shape having a diameter greater than that of the outer conductor 52. The lower end of the outer conductor 52 extends to the surface of the wave retardation member 82, and an upper flange member 84 to which an electric field sensor 140 to be described later is attached is disposed to cover the rear surface (top surface) of the wave retardation member 82. A lower flange member 85 for fixing the wave retardation member 82 is disposed to surround the outer peripheral surface of the wave retardation member 82.

The wave retardation member 82 has a dielectric constant greater than that of a vacuum and is made of quartz, ceramic, a fluorine-based resin such as polytetrafluoroethylene or the like, or a polyimide-based resin. The wave retardation member 82 has a function of reducing the size of the antenna by shortening the wavelength of the microwave compared to that in the vacuum. The wave retardation member 82 can adjust the phases of the microwaves depending on its thickness. The thickness of the wave retardation member 82 is adjusted such that an antinode of the standing wave is formed at the planar slot antenna 81. Accordingly, it is possible to maximize the radiation energy of the planar slot antenna 81 while minimizing the reflection.

The microwave transmission window 110b of the ceiling plate 110 is disposed on the front surface (bottom surface) of the planar slot antenna 81. The microwaves amplified by the main amplifier 48 pass through the gap between the circumferential walls of the inner conductor 53 and the outer conductor 52, and then are emitted from the planar slot antenna 81 into the space in the chamber 1 through the microwave transmission window 110b.

Figure 7:
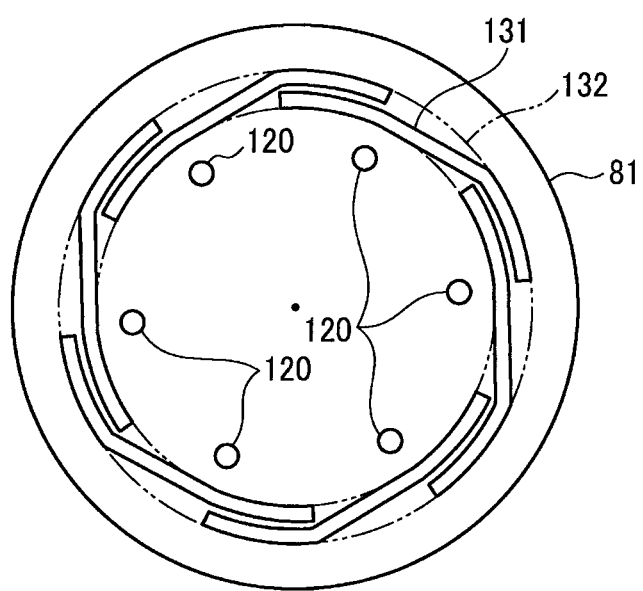
FIG. 7 is a top view showing an example of a planar slot antenna.

As shown in FIG. 7, for example, the planar slot antenna 81 may have a disc shape (planar shape) as a whole. Six slots 131 of the planar slot antenna 81 are arranged along a circumferential direction to form a circumferential shape as a whole. In the example of FIG. 7, the slots 131 have the same shape that is elongated along the circumference. At a joint portion of adjacent slots 131, an end portion of one slot 131 that is positioned at an outer side overlaps with an end portion of another slot 131 that is positioned at an inner side. In other words, the central portion of each slot 131 connects one end portion thereof at the outer side with the other end portion thereof at the inner side so that, in an annular region 132 indicated by dashed double-dotted lines where the six slots 131 are included, the central portion of each slot 131 obliquely connects one end portion thereof in contact with the outer circumference of the annular region 132 with the other end thereof in contact with the inner circumference of an annular region 132. The joint portion between circumferentially adjacent slots is covered by the slots, so that there is no portion without slots in the circumferential direction.

The slots 131 preferably have a length of $(\lambda g/2) \times n - \delta$. Here, $\lambda g$ indicates an effective wavelength of the microwave; n is an integer of 1 or more; and δ indicates a fine-tuning component (including 0) that is finely tuned such that the uniformity of the electromagnetic field intensity is increased in the circumferential direction (angular direction). The central portion of the slot 131 and the opposite end portions thereof (overlapped portions) have substantially the same length. The slots 31 are preferably arranged such that the inner circumferences thereof are spaced from the center of the planar slot antenna 81 by a distance of $(\lambda g/4) \times n \pm \delta'$. Here, n is an integer of 1 or more, and δ' indicates a fine-tuning component (including 0) that is finely tuned to obtain uniform distribution of the electromagnetic field intensity in the diametrical direction.

By using the planar slot antenna 81, it is possible to prevent the electromagnetic wave intensity from being decreased at the joint portion between the slots and improve the plasma uniformity in the circumferential direction (angular direction). The number and shape of the slots are not limited to those shown in FIG. 7. For example, a plurality of circular arc-shaped slots may be uniformly arranged on the circumference.

As shown in FIGS. 4 and 7, in a region at the inner side of the slots 131, sensor insertion holes 120 are formed through the wave retardation member 82 and the planar slot antenna 81 up to the surface of the microwave transmission window 110b of the ceiling plate 110. The number of the sensor insertion holes 120 can be n times the number of the slots 131 where n is an integer of 1 or more. The sensor insertion holes 120 are formed at regular intervals (distanced at the same angle) on the same circumference around the axis of the coaxial waveguide 44. In the example of FIG. 7, the number of the slots 131 and the number of the sensor insertion holes 120 is six (n=1).

As shown in FIG. 4, each of the sensor insertion holes 120 has a large-diameter portion formed through the wave retardation member 82 and a small-diameter portion formed through the planar slot antenna 81. A flat portion 120a is formed at the boundary thereof. The tip end of the electric field sensor 140 is inserted into at least one of the sensor insertion holes 120 (see FIG. 4). The main body of the electric field sensor 140 is inserted into an installation hole formed in the upper flange member 84. A plug (dummy plug) for preventing electromagnetic wave leakage may be inserted into the sensor insertion hole 120 into which no electric field sensor 140 is inserted. A measurement unit 150 is connected to the electric field sensor 140 through a signal cable 151 (see FIG. 4).

In the present embodiment, the main amplifier 48, the tuner 60, and the planar slot antenna 81 are arranged close to one another. The tuner 60 and the planar slot antenna 81 form a lumped constant circuit within a ½ wavelength. The combined resistance of the planar slot antenna 81, the wave retardation member 82, and the microwave transmission window 110b is set to 50Ω. Therefore, the tuner 60 can directly tune the plasma load, and the energy can be efficiently transferred to the plasma.

(Electric Field Sensor)

Next, the electric field sensor 140 will be described.

Figure 8:
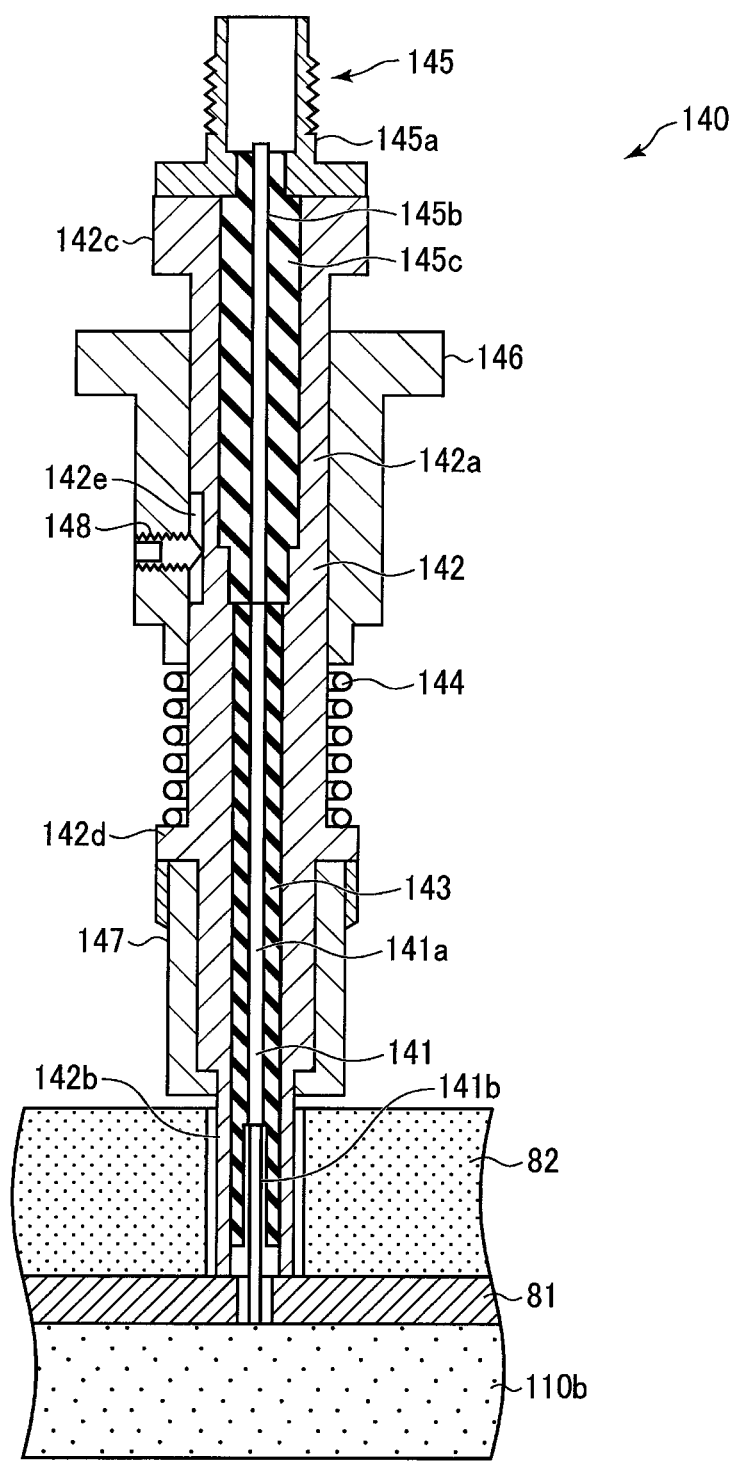
FIG. 8 is a cross-sectional view showing a schematic configuration of the electric field sensor applied to the surface wave plasma source.
Figure 9:
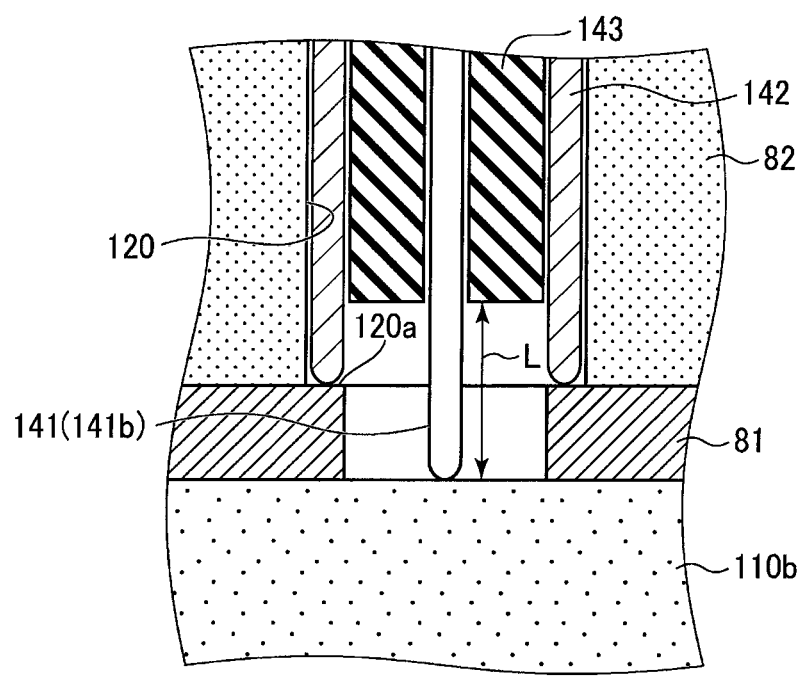
FIG. 9 is an enlarged cross-sectional view showing main parts of the electric field sensor shown in FIG. 8.

FIG. 8 is a cross-sectional view showing a schematic configuration of the electric field sensor 140. FIG. 9 is an enlarged cross-sectional view showing main parts of the electric field sensor 140.

The electric field sensor 140 is configured to detect the electric field of the microwaves emitted from the microwave emission mechanism 41. As described above, the electric field sensor 140 is installed to the upper flange member 84 by inserting the main body thereof into the installation hole formed in the upper flange member 84. The electric field sensor 140 includes a probe 141 serving as an inner conductor of a coaxial transmission path, a probe guide 142 disposed at the outer side of the probe 141 to serve as an outer conductor of the coaxial transmission path, an insulating member 143 disposed between the probe 141 and the probe guide 142, a preload spring 144 for preloading the probe guide 142, and a high-frequency connector 145. The probe 141 and the probe guide 142 form the coaxial transmission path.

The probe 141 has a base portion 141a with a built-in spring and a small-diameter portion 141b whose diameter is smaller than that of the base portion 141a. The small-diameter portion 141b protrudes downward from the base portion 141a and is pressed downward by the built-in spring. The tip end of the small-diameter portion 141b protrudes from the tip end of the insulating member 143. The protruding portion of the tip end of the small-diameter portion 141b forms a monopole antenna. The small-diameter portion 141b of the probe 141 is always in contact with the rear surface of the microwave transmission window 110b with a constant force by a pressing force of the built-in spring. Accordingly, a high-frequency signal propagating through the microwave transmission window 110b can be stably detected with high sensitivity. In addition, the contact between the probe 141 and the microwave transmission window 110b can be maintained even if there are external factors such as changes in the thermal expansion due to temperature changes and/or vibration of the apparatus, which indicates that it is difficult to affect the contact with the external factors. The probe 141 is made of a highly conductive material, e.g., a copper alloy such as beryllium copper (BeCu) or the like. A commercially available contact probe (spring probe) may be used as the probe 141. It is preferred that a length L of the portion of the small-diameter portion 141b of the probe 141 that forms the monopole antenna, which is shown in FIG. 9, is smaller. The length L is preferably in a range from 1.5 mm to 2 mm. The diameter of the portion forming the monopole antenna is in a range from about 0.5 to 1 mm.

In this example, the tip end of the probe 141 (small-diameter portion 141b) has an R shape (fillet shape) as shown in FIG. 9, so that highly stable signal detection can be performed. However, the tip end of the probe 141 may have other various shapes depending on the state of the microwave transmission window 110b or the required signal detection characteristics (stability, accuracy, and the like) as shown in FIGS. 10A to 10F. Each of FIGS. 10A to 10F shows a side view and a bottom view of the different tip end shape. FIG. 10A shows a conical tip end. FIG. 10B shows a pyramidal tip end. FIG. 10C shows a tip end having sharp protrusions. FIG. 10D shows a wide tip end having a plurality of pyramidal protrusions on a flat bottom surface thereof. FIG. 10E shows a flat tip end. FIG. 10F shows a wide and R-shaped tip end.

The probe guide 142 includes a cylindrical main body 142a having a flange portion 142c at an upper end thereof and a small-diameter portion 142b extending downward from the main body 142a. The small-diameter portion 142b is inserted into the sensor insertion hole 120 and the tip end thereof comes into contact with the flat portion 120a between the large-diameter portion and the small-diameter portion of the sensor insertion hole 120 of the planar slot antenna 81, as shown in FIG. 9. The tip end of the probe guide 142 (the small-diameter portion 142b) has a fillet shape. The probe guide 142 is made of a highly conductive material, e.g., an aluminum alloy or brass.

A material of the insulating member 143 is not limited as long as it is made of an insulator, and a resin material such as PTFE, PEEK or the like may be preferably used.

The preload spring 144 is, e.g., a compression-type spring and preloads the probe guide 142 downward as will be described later in detail. Accordingly, the tip end of the probe guide 142 is brought into contact with the rear surface of the planar slot antenna 81 with a constant force, which makes it possible to reduce the noise of the signal. Further, the contact between the probe guide 142 and the planar slot antenna 81 can be maintained even if there are external factors such as changes in thermal expansion due to temperature changes and/or vibration of the apparatus, which indicates that it is difficult to affect the contact with the external factors.

The high-frequency connector 145 is connected to the probe 141 and the probe guide 142 to connect coaxial signal cables for extracting signals. The high-frequency connector 145 has a connection portion 145a, a central conductor 145b, and an insulating member 145c. The connection portion 145a is made of a conductor having a thread formed on the outer surface thereof. The connection portion 145a is fixed and connected to the flange portion 142c of the probe guide 142. The central conductor 145b extends downward from the connection portion 145a and is connected to the probe 141. The insulating member 145c insulates the probe guide 142 from the central conductor 145b. The central conductor 145b and the probe 141 constitute the inner conductor of the coaxial cable. Similar to the insulating member 143, the insulating member 145c may be made of an insulating material, and may be preferably made of a resin material such as PTFE, PEEK, or the like.

The electric field sensor 140 further includes a fixing nut 146, a band-type contact 147, and a rotation stopper 148.

The fixing nut 146 is screw-coupled to the outer side of the probe guide 142 and also screw-coupled to the upper flange member 84. The probe guide 132 is fixed by tightening the fixing nut 146.

The preload spring 144 is disposed between the fixing nut 146 and the probe guide 142. Specifically, a brim-shaped spring receiving part 142d is formed on the probe guide 142 at a position under the fixing nut 146, and the preload spring 144 is disposed between the fixing nut 146 and the spring receiving part 142d. By tightening the fixing nut 146 to the upper flange member 84, the preload spring 144 is compressed and the spring receiving part 142d is pressed by the pressing force of the preload spring 144 and, thus, the probe guide 142 is preloaded downward. Accordingly, as described above, the tip end of the probe guide 142 comes into constant contact with the rear surface of the planar slot antenna 81, which makes it possible to stably detect the signal while reducing the noise of the signal.

Figure 11:
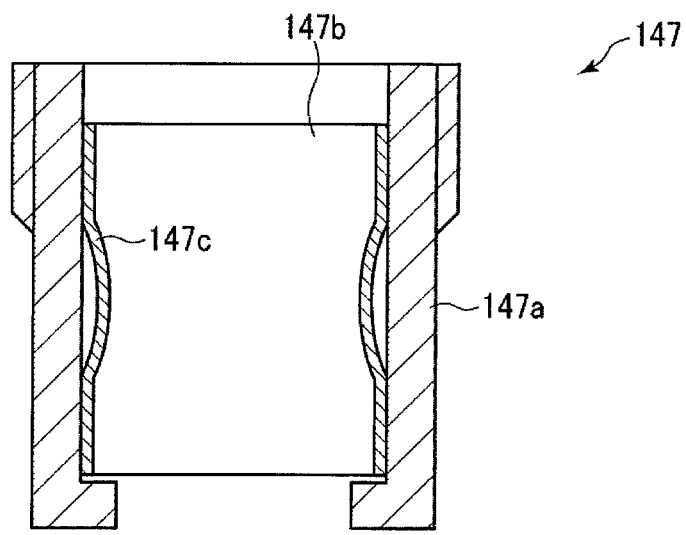
FIG. 11 is a cross-sectional view showing a band-type contact in the electric field sensor.
Figure 12:
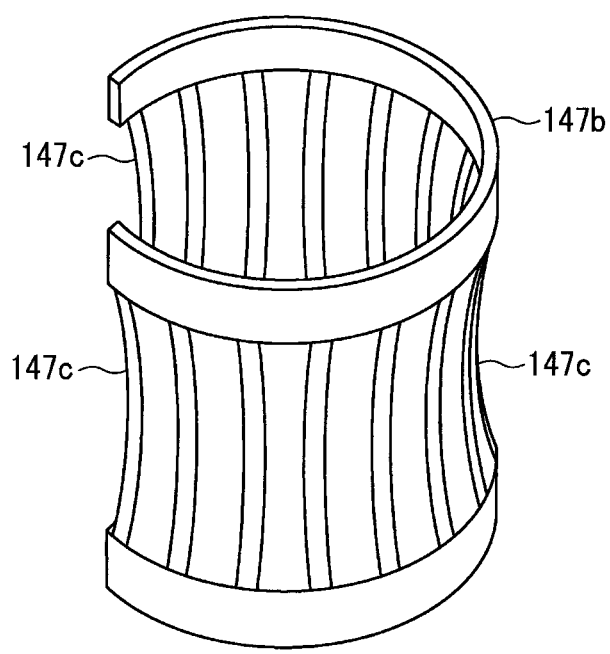
FIG. 12 is a perspective view showing a contact member of the band-type contact shown in FIG. 11.

As shown in FIG. 11, the band-type contact 147 is disposed to surround an outer periphery of the probe guide 142 at a position under the spring receiving part 142d. The band-type contact 147 has a cylindrical main body 147a made of a conductive material and a contact member 147b disposed at an inner side of the main body 147a. As shown in FIG. 12, the contact member 147b is formed by arranging a plurality of plate springs 147c, each being made of a conductive material, e.g., a copper alloy, along a circumferential direction while the central portions of the plate springs protrude inward. The band-type contact 147 is fixed to the upper flange member 84 having a ground potential while the outer peripheral surface of the band-type contact 147 is in contact with the upper flange member 84. When the probe guide 142 is inserted into the band-type contact 147, the probe guide 142 is reliably brought into contact with the band-type contact 147 via the plate springs 147c even if the probe guide 142 is rotated, vertically moved, or tilted. Therefore, stable electrical connection between the probe guide 142 and the upper flange member 84 is ensured and the probe guide 142 can be reliably set to the ground potential through the band-type contact 147. Accordingly, stable signal detection can be performed.

Figure 13:
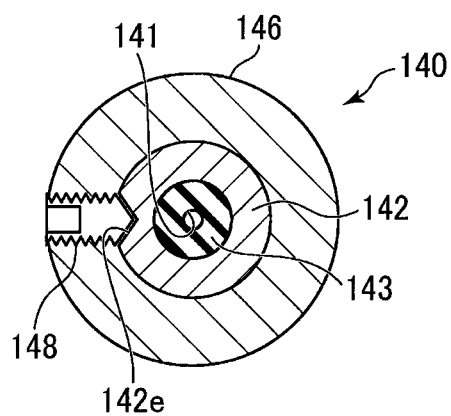
FIG. 13 is a horizontal cross-sectional view showing a state in which a rotation stopper is attached to the electric field sensor.

The rotation stopper 148 is installed at the fixing nut 146 to restrict the rotation of the probe guide 142 while allowing the vertical movement of the probe guide 142. In this example, the rotation stopper 148 is a set screw and is screw-coupled to a screw hole formed through a side surface of the fixing nut 146. As shown in the horizontal cross-sectional view of FIG. 13, the rotation stopper 148 has a sharp tip end and is inserted into a recess 142e formed in a side surface of the probe guide 142 to be movable vertically. Therefore, the vertical movement of the probe guide 142 is allowed, whereas the rotation of the probe guide 142 is restricted. By restricting the rotation of the probe guide 142, the rotation of the high-frequency connector 145 fixed to the probe guide 142 is also restricted. Hence, when the signal cable is connected to the high-frequency connector 145, it is possible to prevent the signal cable from being twisted and to avoid damage to the signal cable that is hard and has a large minimum radius of curvature. Further, since the rotation of the probe guide 142 is restricted, the rotation of the contact portions of the tip ends of the probe 141 and the probe guide 142 is restricted and, thus, the influence of the movement of the signal cable and the vibration transmitted through the signal cable is suppressed. Accordingly, the stable signal detection can be performed.

As described above, in the electric field sensor 140, the tip end of the probe 141 is brought into contact with the rear surface of the microwave transmission window 110b and the tip end of the probe guide 142 is brought into contact with the rear surface of the planar slot antenna 81. Accordingly, the microwaves (electromagnetic waves) emitted from the slots 131 and propagating through the microwave transmission window 110b made of a dielectric material are inputted to the electric field sensor 140, thereby extracting the signals. In other words, the electric field of the microwaves (electromagnetic waves) of the microwave emission mechanism 41 can be detected.

In the present embodiment, single-mode surface wave plasma is generated, so that the standing waves generated in the dielectric member constituting the microwave transmission window 110b have the same pattern. Further, the positions of the antinodes and the nodes of the standing waves are fixed, and the magnitude of the standing waves increases as the antenna output power increases. The electric field sensor 140 utilizes these characteristics. In other words, if the electric field sensor 140 is brought into contact with the rear surface of the microwave transmission window 110b while avoiding the antinodes and the nodes of the standing waves, it is possible to directly monitor the power of the microwave (electromagnetic waves) outputted from the slots 131.

Figure 14:
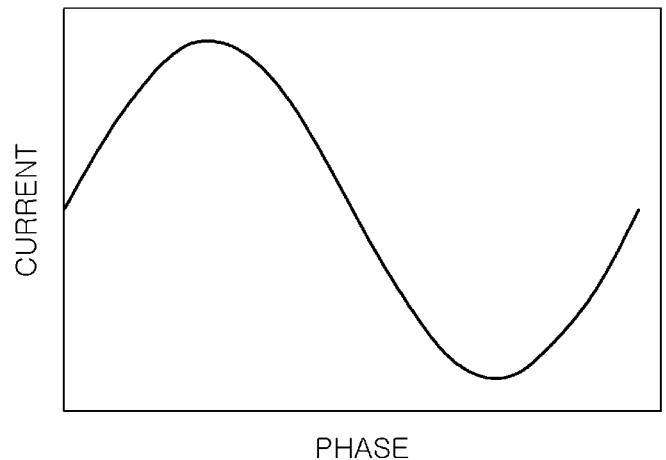
FIG. 14 shows a monitor power detected by the electric field sensor.

The monitor power at this time can be obtained based on, e.g., a monitor current flowing through a monitor line shown in FIG. 14. In this case, the monitor current flowing through the monitor line changes depending on the length of the monopole portion of the tip end of the probe 141. Therefore, the desired monitor power can be extracted by adjusting the length of the monopole portion.

Figure 15:
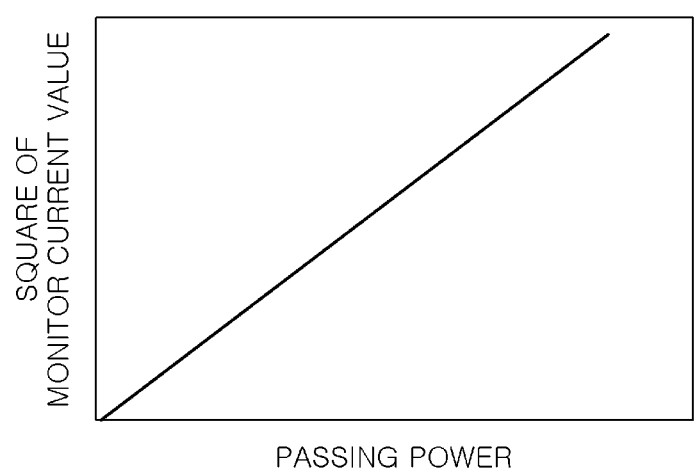
FIG. 15 shows a relationship between a power emitted from the planar slot antenna and the square of a monitor current.

Although the value of the monitor current flowing through the monitor line is proportional to the electric field, the power passing through the microwave transmission window 110b is proportional to the square of the electric field and, thus, the square of the monitor current value is proportional to the power passing through the microwave transmission window 110b. Such a relationship is shown in FIG. 15. On the assumption that the power loss from the power supply to the microwave transmission window 110b is negligibly small and substantially all the energy is absorbed by the plasma, the input power is substantially equal to the power passing through the microwave transmission window 110b.

The signal detected by the electric field sensor 140 is transmitted to the measurement unit 150 through the signal cable 151 (see FIG. 4). The measurement unit 150 compares the signal with a pre-stored threshold to determine whether or not electromagnetic waves are normally emitted from the planar slot antenna 81. Since the electric field sensor 140 faces the plasma through the microwave transmission window 110b, the changes in the impedance of the plasma can be detected by monitoring the changes in the value of the output electric field of the planar slot antenna 81 when changing, for example, the conditions of the plasma (gas type, pressure, and the like). The electric field sensor 140 can also be used as a device for detecting plasma ignition and plasma non-ignition.

(Operation of the Surface Wave Plasma Processing Apparatus)

Next, an operation of the surface wave plasma processing apparatus 100 configured as described above will be described.

First, the wafer W is loaded into the chamber 1 and mounted on the susceptor 11. Then, microwaves are fed from the surface wave plasma source 2 into the chamber 1 while supplying a plasma gas, e.g., Ar gas, from the plasma gas supply source 27 into the chamber 1 through the line 28 and the plasma gas introduction member 26. Accordingly, the surface wave plasma is generated.

After the surface wave plasma is generated, a processing gas, e.g., an etching gas such as $Cl_2$ gas, is injected from the processing gas supply source 25 into the chamber 1 through the line 24 and the shower plate 20. The injected processing gas is excited by the plasma that has passed through the spaces 23 of the shower plate 20, thereby generating plasma of the processing gas. The plasma processing, e.g., etching, is performed on the wafer W by the plasma of the processing gas.

In order to generate the surface wave plasma, in the surface wave plasma source 2, the microwave power oscillated by the microwave oscillator 32 of the microwave output unit 30 is amplified by the amplifier 33, and the amplified microwave power is divided into a plurality of microwave powers by the divider 34. Then, the divided microwave powers are guided to the microwave supply unit 40. In the microwave supply unit 40, the divided microwave powers are individually amplified by the main amplifier 48 constituting the solid-state amplifier and supplied to the waveguide 44 of the microwave emission mechanism 41. Accordingly, the impedance is automatically matched by the tuner 60 and, in a state with substantially no power reflection, the microwaves are emitted (fed) into the chamber 1 from the slots 131 of the planar slot antenna 81 of the antenna unit 43 and the microwave transmission window 110b, and spatially combined.

The power is supplied to the waveguide 44 of the microwave emission mechanism 41 from the side surface of the waveguide 44 through the coaxial line 56. In other words, the microwaves (electromagnetic waves) transmitted through the coaxial line 56 are supplied to the waveguide 44 from the microwave power introduction port 55 disposed at the side surface of the waveguide 44. When the microwaves (electromagnetic waves) reach the first pole 92 of the power supply antenna 90, the microwaves (electromagnetic waves) propagate along the antenna main body 91 and are emitted from the second pole 93 disposed at the tip end of the antenna main body 91. Further, the microwaves (electromagnetic waves) propagating through the antenna main body 91 are reflected by the reflection portion 94 and combined with incident waves, thereby generating standing waves. When the standing waves are generated at the location of the power supply antenna 90, an induced magnetic field is generated along the outer wall of the inner conductor 53 and, thus, an induced electromagnetic field is generated. Due to such chain actions, the microwaves (the electromagnetic waves) propagate through the waveguide 44 and are transmitted to the antenna unit 43.

At this time, in the waveguide 44, a maximum microwave (electromagnetic wave) power can be transmitted into the waveguide 44 having a coaxial structure by reflecting the microwaves (electromagnetic waves) emitted from the power supply antenna 90 by the reflection plate 58. In that case, it is preferred to set the distance from the power supply antenna 90 to the reflection plate 58 to be approximately a multiple of the half-wavelength of λg/4 in order to effectively combine the microwaves with the reflected waves.

The microwave emission mechanism 41 is very compact since the antenna unit 43 and the tuner 60 are formed as one unit. Therefore, it is possible to make the surface wave plasma source 2 compact. Further, the main amplifier 48, the tuner 60, and the planar slot antenna 81 can be arranged close to one other. Especially, the tuner 60 and the planar slot antenna 81 can constitute a lumped constant circuit. Further, the plasma load can be tuned with high precision by the tuner 60 by setting the combined resistance of the planar slot antenna 81, the wave retardation member 82, and the microwave transmission window 110b to 50Ω. Further, since the tuner 60 constitutes a slag tuner capable of performing impedance matching simply by moving the two slags 61a and 61b, the tuner 60 is compact and has low loss. Since the tuner 60 and the planar slot antenna 81 adjacent to each other constitute the lumped constant circuit and function as a resonator, the impedance mismatching up to the planar slot antenna 81 can be solved with high precision, and the mismatching portion can be substantially used as a plasma space. Accordingly, the plasma control can be performed with high precision by the tuner 60.

The electric field sensor 140 can detect the electric field of the microwaves emitted from the planar slot antenna 81 of the microwave emission mechanism 41 and propagated through the microwave transmission window 110b, so that it is possible to determine whether or not the microwaves are normally emitted from the planar slot antenna 81. Further, since the electric field sensor 140 faces the surface wave plasma through the microwave transmission window 110b, the impedance change of the plasma can be detected by monitoring the electric field of the microwaves. In addition, the electric field sensor 140 can be used as a device for detecting plasma ignition and plasma non-ignition.

Japanese Patent Application Publication No. 2013-77441 discloses that the above-described effects can be obtained by using the electric field sensor in a surface wave plasma processing apparatus. However, when the electric field sensor disclosed in the above Publication is used in the surface wave plasma processing apparatus, it is not possible to avoid the influence of the noise and/or the external factors (vibration, temperature, and the like) and the sensitivity tends to vary significantly. In addition, the reproducibility of signals is poor when the electric field sensor is repeatedly installed and detached, and it is also difficult to confirm whether or not the electric field sensor is correctly installed.

Therefore, in the present embodiment, the probe 141 serving as the inner conductor of the electric field sensor 140 has a built-in spring and the tip end of the probe 141 is brought into contact with the microwave transmission window 110b with a constant force. Accordingly, a high-frequency signal propagating through the microwave transmission window 110b can be stably detected with high sensitivity. Further, the probe guide 142 serving as the outer conductor is brought into contact with the rear surface of the planar slot antenna 81 by the preload spring 144 with a constant force. Accordingly, the noise of the signal can be reduced. In addition, the probe 141 and the probe guide 142 are brought into contact with the planar slot antenna 81 and the microwave transmitting plate 110b, respectively, with a constant force by the pressing force of the spring. As a result, the following effects (1) and (2) can be obtained: (1) the contact can be maintained regardless of the external factors such as changes in the thermal expansion due to temperature changes and/or vibration of the apparatus, which indicates that it is difficult to affect the contact with the external factors; and (2) the reproducibility can be improved regardless of the repeated installation and detachment of the electric field sensor and it is not required to strictly confirm the installation of the electric field sensor.

The preload spring 144 preloads the probe guide 142 when the probe guide 142 is fixed by tightening the fixing nut 142 to the upper flange member 84. Therefore, it is not required to provide an additional mechanism for the preloading, which makes the configuration simple.

Further, the band-type contact 147 is disposed to be in contact with the grounded upper flange member 84 and the probe guide 142 is inserted into the band-type contact 147 to ensure stable electrical connection. Therefore, the stable electrical connection between the grounded upper flange member 84 and the probe guide 142 can be ensured, and the probe guide 142 can be reliably set to the ground potential through the band-type contact 147. Accordingly, signal detection can be performed more stably.

Further, by inserting the rotation stopper 148 from the side surface of the fixing nut 146, it is possible to restrict the rotation of the probe guide 142 while allowing the vertical movement of the probe guide 142. Thus, when the signal cable is connected to the high-frequency connector 145 fixed to the probe guide 142, it is possible to prevent the signal cable from being twisted and to avoid damage to the signal cable that is hard and has a large minimum radius of curvature. Since the rotation of the probe guide 142 is restricted, the rotation of the contact portions of the tip ends of the probe 141 and the probe guide 142 is restricted. Hence, it is possible to suppress the influence of the movement of the signal cable and the vibration transmitted through the signal cable. Accordingly, signal detection can be performed more stably. In addition, since the set screw is used as the rotation stopper 148, it is possible to reliably stop the rotation of the probe guide 142.

(Other Applications)

The presently disclosed embodiments of the present disclosure are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, in the above embodiment, the surface wave plasma source having a plurality of microwave emission mechanisms has been described as an example. However, the surface wave plasma source may have one microwave emission mechanism.

Further, the components included the electric field sensor are not limited to those of the above-described embodiments. For example, as the rotation stopper, other components such as a parallel pin or the like may be used instead of the set screw.

Although the etching apparatus has been described as an example of the plasma processing apparatus, the present disclosure is not limited thereto and may be applied to another plasma processing apparatus for performing film formation, oxy-nitriding, ashing, or the like. The substrate is not limited to the semiconductor wafer W and may be another substrate such as a ceramic substrate, a flat panel display (FPD) substrate represented by a liquid crystal display (LCD) substrate, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. An electric field sensor for detecting an electric field of microwaves in generating surface wave plasma by emitting microwaves transmitted through a microwave transmission path into a chamber through slots of a planar slot antenna and a microwave transmission window made of a dielectric material, the electric field sensor comprising:
    a probe serving as an inner conductor of a coaxial transmission path and having a built-in spring and a portion forming a monopole antenna at a tip end thereof so that the tip end of the probe is in constant contact with a rear surface of the microwave transmission window by a pressing force of the built-in spring;
    a cylindrical probe guide disposed at an outer side of the probe, serving as an outer conductor of the coaxial transmission path, and having a tip end to be in contact with a rear surface of the planar slot antenna;
    an insulating member disposed between the probe and the probe guide;
    a preload spring configured to preload the probe guide downward and press the probe guide so that the tip end of the probe guide comes in constant contact with the planar slot antenna; and
    a connector connected to the probe and the probe guide and configured to connect coaxial signal cables for extracting signals.

2. The electric field sensor of claim 1, wherein a length of the portion of the probe that forms the monopole antenna is within a range from 1.5 to 2 mm.

3. The electric field sensor of claim 1, wherein the tip end of the probe has a fillet shape.

4. The electric field sensor of claim 1, wherein the tip end of the probe guide has a fillet shape.

5. The electric field sensor of claim 1, further comprising:
    a fixing nut into which the probe guide is inserted, and configured to fix the probe guide to a fixing portion, wherein when the fixing nut is tightened to the fixing portion, the preload spring is compressed and the probe guide is preloaded downward.

6. The electric field sensor of claim 5, further comprising:
a rotation stopper installed at the fixing nut and configured to restrict a rotation of the probe guide while allowing a vertical movement of the probe guide.

7. The electric field sensor of claim 6, wherein the rotation stopper is a set screw that is screw-coupled to a screw hole formed through a side surface of the fixing nut, and a tip end of the rotation stopper is inserted into a recess formed in a side surface of the probe guide to be vertically movable.

8. The electric field sensor of claim 1, further comprising:
a band-type contact connected to a ground potential and having a cylindrical main body made of a conductive material and a contact member disposed at an inner side of the main body to be in contact with the main body,
wherein the contact member is formed by arranging a plurality of plate springs, each being made of a conductive material, along a circumferential direction while central portions of the plate springs protrude inward, and
when the probe guide is inserted into the contact member, electrical connection between the probe guide and the contact member is ensured.

9. The electric field sensor of claim 7, further comprising:
a band-type contact connected to a ground potential and having a cylindrical main body made of a conductive material and a contact member disposed at an inner side of the main body to be in contact with the main body,
wherein the contact member is formed by arranging a plurality of plate springs, each being made of a conductive material, along a circumferential direction while central portions of the plate springs protrude inward, and
when the probe guide is inserted into the contact member, electrical connection between the probe guide and the contact member is ensured.

10. A surface wave plasma source for generating surface wave plasma in a chamber by supplying microwaves into the chamber, comprising:
a microwave output unit configured to output microwaves;
at least one microwave emission mechanism disposed on a microwave transmission path for transmitting the microwaves outputted from the microwave output unit and configured to emit the microwaves into the chamber; and
the electric field sensor described in claim 1 configured to detect an electric field of the microwaves emitted from the at least one microwave emission mechanism,
wherein the at least one microwave emission mechanism includes:
a planar slot antenna configured to emit the microwaves transmitted through the microwave transmission path into the chamber from slots of the planar slot antenna;
a wave retardation member made of a dielectric material and disposed on an upstream side in a microwave transmission direction of the planar slot antenna,
a microwave transmission window made of a dielectric material and disposed on a downstream side in the microwave transmission direction of the planar slot antenna, and
at least one sensor insertion hole formed through the wave retardation member and the planar slot antenna wherein the electric field sensor is inserted into the at least one sensor insertion hole.

11. The surface wave plasma source of claim 10, wherein the at least one sensor insertion hole includes two or more sensor insertion holes arranged at regular intervals on the same circumference around an axis of the microwave transmission path in a region at the inner side of the slots of the planar slot antenna,
the number of the two or more sensor insertion holes is n times the number of the slots where n is an integer of 1 or more, and
the electric field sensor is inserted into at least one of the two or more sensor insertion holes.

12. The surface wave plasma source of claim 10, wherein the at least one microwave emission mechanism includes two or more microwave emission mechanisms, and the microwaves emitted from the two or more microwave emission mechanisms into the chamber are combined in a space in the chamber to thereby generate the surface wave plasma.

13. The surface wave plasma source of claim 11, wherein the at least one microwave emission mechanism includes two or more microwave emission mechanisms, and the microwaves emitted from the two or more microwave emission mechanisms into the chamber are combined in a space in the chamber to thereby generate the surface wave plasma.

14. A surface wave plasma processing apparatus for processing a substrate with surface wave plasma, comprising:
a chamber accommodating the substrate;
a gas supply mechanism configured to supply a gas into the chamber; and
the surface wave plasma source of claim 10 configured to generate the surface wave plasma by supplying microwaves into the chamber.

15. A surface wave plasma processing apparatus for processing a substrate with surface wave plasma, comprising:
a chamber accommodating the substrate;
a gas supply mechanism configured to supply a gas into the chamber; and
the surface wave plasma source of claim 11 configured to generate the surface wave plasma by supplying microwaves into the chamber.

16. A surface wave plasma processing apparatus for processing a substrate with surface wave plasma, comprising:
a chamber accommodating the substrate;
a gas supply mechanism configured to supply a gas into the chamber; and
the surface wave plasma source of claim 12 configured to generate the surface wave plasma by supplying microwaves into the chamber.

* * * * *